United States Patent
Tuchiya et al.

(10) Patent No.: US 6,336,581 B1
(45) Date of Patent: Jan. 8, 2002

(54) SOLDER BALL CONNECTION DEVICE AND CAPILLARY TUBE THEREOF

(75) Inventors: Tatsumi Tuchiya, Ayase; Tatsushi Yoshida, Chigasaki; Yasuhiro Mita, Fujisawa; Tadaaki Tomiyama, Chofu; Takao Kidachi, Yamato, all of (JP); Surya Pattanaik, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/629,481

(22) Filed: Jun. 19, 2000

(51) Int. Cl.[7] .............................. B23K 1/00; B23K 35/12
(52) U.S. Cl. ........................ 228/33; 228/41; 228/245; 228/246
(58) Field of Search .............................. 228/33, 35, 41, 228/42, 37, 45, 254, 54, 219, 220, 221, 246, 202, 222, 245; 360/104, 103, 105, 106, 108; 29/603

(56) References Cited

U.S. PATENT DOCUMENTS

| | | | | |
|---|---|---|---|---|
| 5,425,493 A | * | 6/1995 | Interrante et al. ........ 228/110.1 |
| 5,478,009 A | * | 12/1995 | Interrante et al. ........... 228/264 |
| 5,653,381 A | * | 8/1997 | Azdasht ....................... 228/254 |
| 5,772,106 A | * | 6/1998 | Ayers et al. ................. 228/254 |
| 5,872,687 A | * | 2/1999 | Arya et al. .................. 360/104 |
| 6,015,083 A | * | 1/2000 | Hayes et al. ................. 228/254 |
| 6,152,348 A | * | 11/2000 | Finn et al. ..................... 228/41 |

* cited by examiner

Primary Examiner—Tom Dunn
Assistant Examiner—Zidia Pittman
(74) Attorney, Agent, or Firm—Robert B. Martin; Bracewell & Patterson L.L.P.

(57) ABSTRACT

A capillary tube for a solder ball connection device connects a first connection surface of a pad to a second connection surface of a pad with a solder ball. The first connection surface is formed at a slider held by a slider holder in a disk unit. The second connection surface is formed at an end of a lead wired to the slider holder. The capillary tube has a ball regulator with a substantially conic, hollow portion. The solder ball regulator has an opening at its top that opens to the tip of the hollow portion. The center axes of the hollow portion and the opening are common. The solder ball regulator also has a pair of projections along the center axis around the opening, where the projections face each other with the center axis therebetween. The projections regulate the movement of the solder ball. The tip of the hollow portion is tapered when viewed from a line connecting the pair of projections and the extreme tips of the tapered tip portions.

24 Claims, 7 Drawing Sheets

(PRIOR ART)

SOLDER BALL CONNECTION DEVICE AND CAPILLARY TUBE THEREOF

TECHNICAL FIELD

The present invention relates to a solder ball connection device for connecting a bonding pad formed at a slider provided with a head, and a lead pad formed at the tip of a lead wire. More particularly, the present invention relates to a tube employed for the solder ball connection apparatus and used to position and hold a solder ball in a solder reflowing process.

DESCRIPTION OF THE RELATED ART

Figure 8:
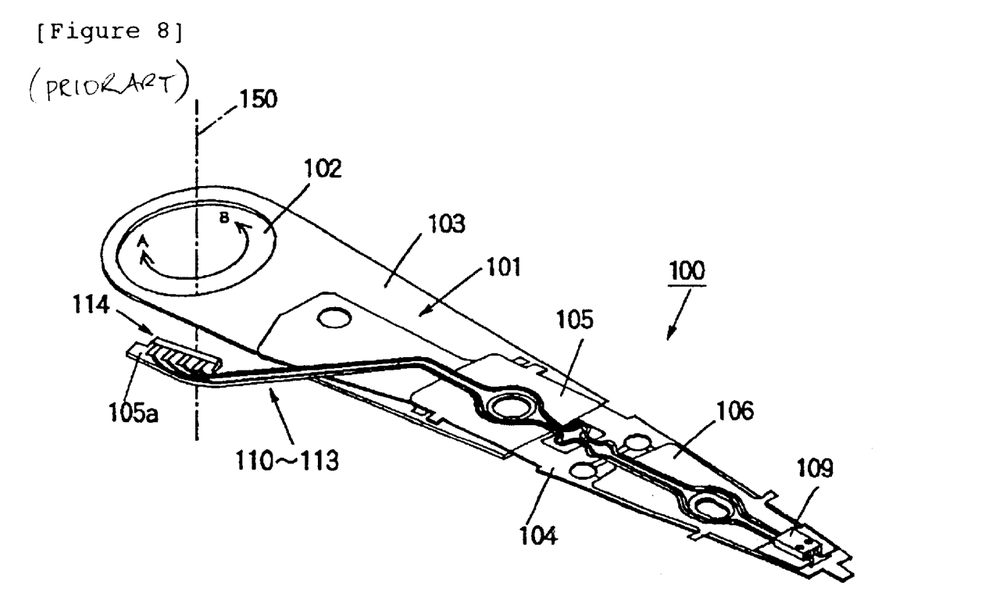
FIG. 8 is a perspective view of a conventional HG assembly.
Figure 9:
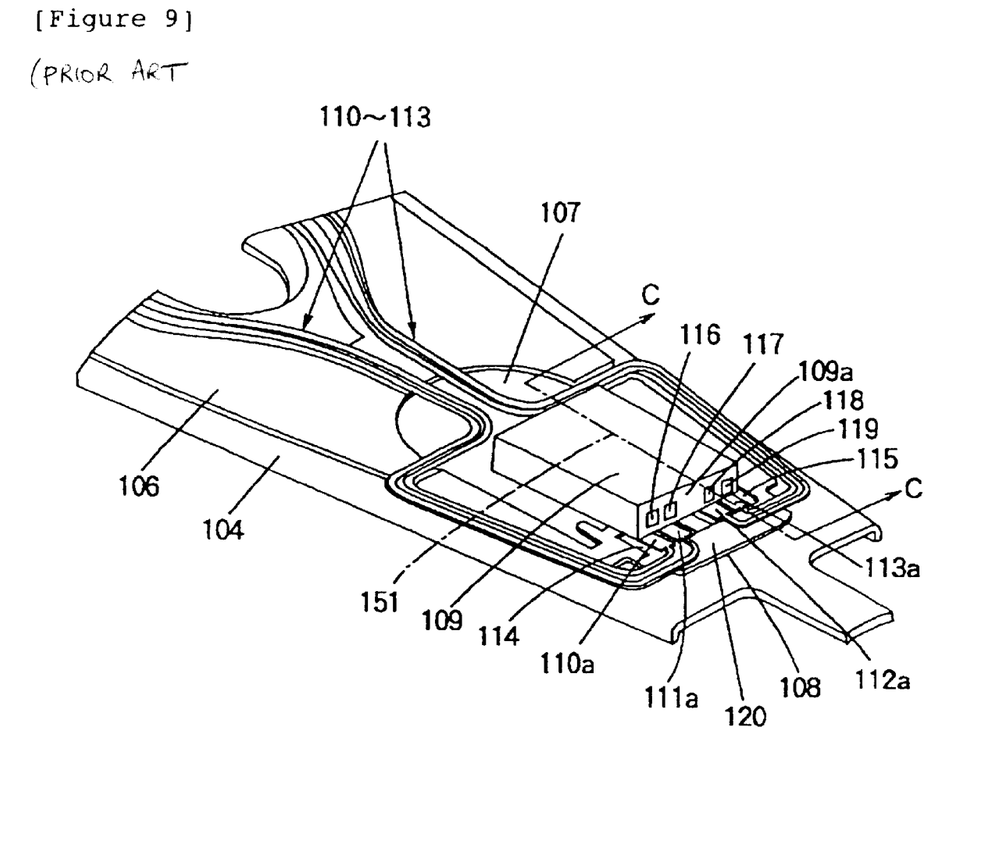
FIG. 9 is a partially expanded view of the tip of the HG assembly of FIG. 8.

FIG. 8 shows a perspective view of the HG assembly suitable for electrical connection between a lead wire and a slider with use of a solder ball connection method. FIG. 9 is an expanded view of the tip of the HG assembly. The external shape of the HG assembly 100 is defined by an actuator arm 101 provided with an opening 102 and a load beam 104 extended in the longitudinal direction of the actuator arm 101 from an intermediate portion of its flat portion 103. The actuator arm 101 and the load beam 104 are bonded together at a portion where they are placed on top of each other.

The opening 102 is used so that the HG assembly 100 is held rotationally by a holder of a magnetic disk apparatus (not shown). The HG assembly 100, passing through the center of the opening, is rotated in the directions A and B around a virtual axis 150 substantially perpendicular to the flat portion 103. A mount plate 105 is bonded to the load beam 104 substantially in the center portion so as to be put thereon. A flexure 106 is also disposed on the load beam 104 between the center and the tip thereof. This flexure 106 is bonded to the load beam 104 by a half located at the side of the mount plate 105. The other half of the flexure 106 located at the side of the tip is not bonded to the load beam 104.

As shown in FIG. 9, at the tip of the flexure 106 is formed an arch-shaped opening 107 and the slider 109 is bonded fixedly to a flexure tang 106a (FIG. 10) formed so as to be protruded to the center of the arch-shaped opening 107 from a platform 108 formed at the extreme tip of the flexure 106. This flexure tang 106a is supported by a pivot 104a (shown with a broken line in FIG. 10) protruded from the load beam 104 at one point corresponding to the center of the slider 109. Consequently, the slider 109 can be inclined at a predetermined angle (often referred to as a pitch, a roll, or a yaw) in every direction with respect to the load beam 104.

Four leads 110 to 113 are wired partially to an extended portion 105a of the mount plate 105. They are fixed at the extended portion 105a with an insulating sheet therebetween respectively so as not to touch each other. At one ends, they compose a multi-connector 114. The four leads 110 to 113 are connected to the mount plate 105 and the flexure 106 respectively as shown in FIG. 8 and fixed so as not to touch each another with an insulating sheet therebetween respectively. The other ends of the leads are floated in the arch-shaped opening 107 as shown in FIG. 9 and they are paired, crank-bent, and led to the platform 108.

Figure 10:
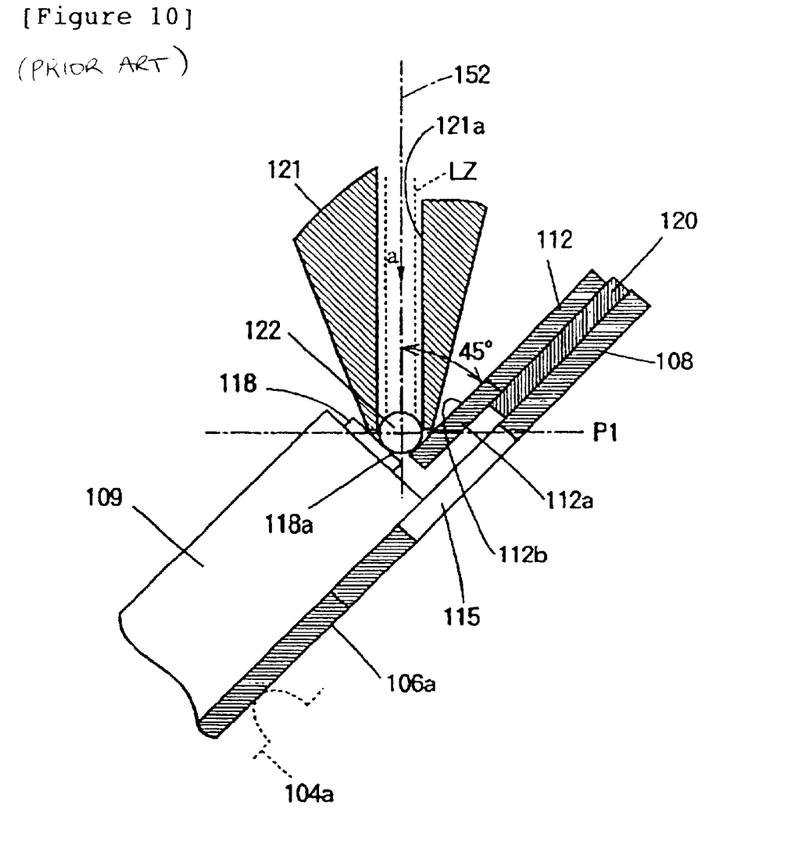
FIG. 10 is a sectional view of a solder ball connection device and a portion of the HG assembly of FIG. 9 along the line 151 through the center of bonding pad 118, the portion being viewed from the direction C.

The paired leads are bent substantially perpendicular to the front surface 109a of the slider 109 through two openings 114 and 115 formed between the platform 108 and the flexure tang 106a (FIG. 10). In addition, the lead pads 110a to 113a are formed corresponding to the connection surfaces of the four bonding pads 116 to 119 formed at this front surface 109a. The four leads 110 to 113 are fixed to the platform 108 around their tips with an insulating sheet 20 therebetween respectively. A part of the HG assembly, where the slider 109 does not exist, is equivalent to the slider holder.

The following is a description of a solder ball connection method for connecting the four bonding pads 116 to 119 to the lead pads 110a to 113a formed so as to be corresponded to those bonding pads 116 to 119.

FIG. 10 is a sectional view of the major portion of the HG assembly from the direction C at a directing line 151. The directing line 151 passes the center of the bonding pad 118 shown in FIG. 9. FIG. 10 also shows a partial cross sectional view of the solder ball connection device. The load beam 104 is not illustrated here so as to simplify the description, but the position of the pivot 104a formed at the load beam 104 is shown with a broken line.

When carrying out a solder ball connection, the inclined HG assembly 100 (FIG. 8) is held by a holder (not shown) so that the pad connection surface 118a of the bonding pad 118 and the connection surface 112b of the lead pad 112a face each other substantially perpendicular and each of those connection surfaces 118a and 112b is inclined substantially at 45° in the direction in which its gravity works.

On the other hand, the capillary tube 121 composes a part of the solder ball connection device (not shown). The capillary tube 121 is disposed in the direction in which the center axis 152 of the cylindrical inner hollow portion 121a can use the gravity, that is, at a position where the tip of the capillary tube 121 comes close to both of the bonding pad 118 and the lead pad 112a while being inclined at about 45° to the connection surface 112b of the lead pad 112a.

The solder ball connection device (not shown) stores many solder balls 122 and sends one solder ball 122 to the tip of the capillary tube 121 through its inner hollow portion 121a after the capillary tube 121 is disposed at a predetermined position. At this time, the apparatus supplies a nitrogen gas ($N_2$) in the direction of the arrow a so as to prompt the solder ball 122 to move together with the action of the gravity. In addition, the nitrogen gas also presses the solder ball 122 slightly that is in contact with both connection surfaces 118a and 112b of the bonding pad 118 and the lead pad 112a when the solder ball 122 exists at the tip of the capillary tube 121.

In this state, the solder ball connection device (not shown) applies a laser beam (shown with a broken line LZ in FIG. 10) to the solder ball 122 through the inner hollow portion 121a of the capillary tube 121 so as to make the solder ball reflow. The solder ball 122 is then melted in this reflowing, getting both connection surfaces 118a and 112b of the bonding pad 118 and the lead pad 112a wet and connected together. The nitrogen gas supplied at this time presses the melted solder against each connection surface and cover the solder so as to be prevented from oxidation.

This completes the description of the solder ball connection for the bonding pad 118 of the slider 109 and the lead pad 112a of the lead 112. The same procedure can also apply to the connections of other three pads only by changing each position to which the capillary tube 121 is provided.

Figure 11:
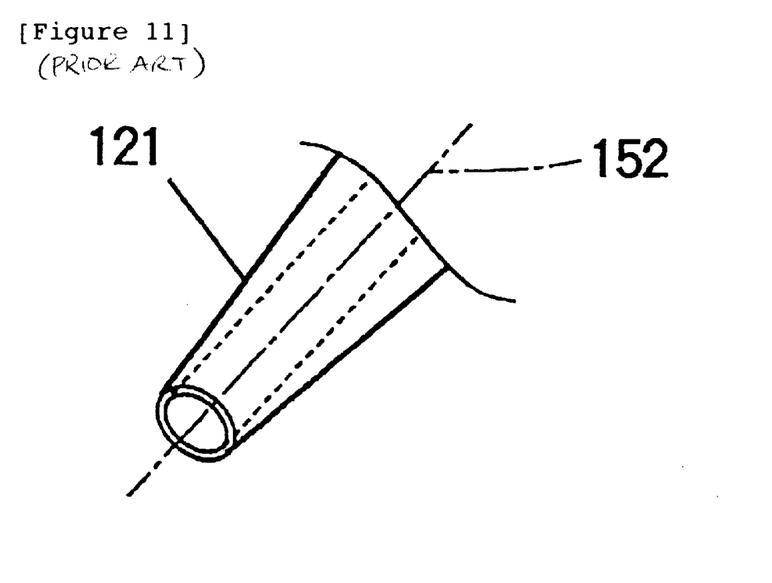
FIG. 11 is a perspective view of a tip shape of a conventional capillary tube.

FIG. 11 is a perspective view of the tip shape of the capillary tube 121. The conic tip of the capillary tube is cut as shown in FIG. 11 so that its cross section perpendicular to the center axis 152 is formed like a ring. In this case, as shown in FIG. 10, it is difficult to move the tip of the capillary tube 121 down up to the regulation point P1 orthogonal to the center line 152 through the center of the solder ball 122, which is in contact with both pads. This is because the tip of the capillary tube 121 comes in contact with any of the pads before reaching the regulation point P1, thereby its up and down movement is disturbed by the pad.

If the tip of the capillary tube 121 does not reach the regulation point P1 as described above, the solder ball 122 can take an idle width at which the solder ball 122 can move in the direction parallel to both connection surfaces 118a and 112b of the bonding pad 118 and the lead pad 112, that is, in the direction passing through the paper with FIG. 10. Consequently, the solder ball 122 comes to reflow the solder ball in an unstable state, thereby the soldering position cannot be decided accurately or a connection failure occurs due to uneven irradiation of the laser beam on the solder ball. Furthermore, as shown in FIG. 10, the laser beam, which passes the inner hollow portion 121a of the capillary tube 121 so as to reflow the solder ball, hits and reflects here and there on the inner wall of the hollow portion 121a until it reaches the solder ball. The energy of the laser beam is thus attenuated due to such reflections, thereby the irradiation efficiency of the laser beam is lowered. To compensate such an attenuation, therefore, the output of the laser beam has been increased as much.

Under such a circumstances, it is an object of the present invention to provide a method for positioning a solder ball to reflow accurately and stabilize the soldering point so as to make the connection perfect, thereby preventing connection failures. It is another object of the present invention to provide a method for making solder ball connection more efficient by reducing the energy loss caused by reflections of the laser beam, thereby reducing the energy loss of the laser beam when in solder reflowing.

SUMMARY OF THE INVENTION

A capillary tube is employed for a solder ball connection device for connecting a first connection surface of a pad to a second connection surface of a pad with use of a solder ball. The pad has the first connection surface formed at a slider held by a slider holder in a disk unit. The pad has the second connection surface formed at an end of a lead wired to the slider holder. The capillary tube has a ball regulator provided with a substantially conic and hollow portion inside. The solder ball regulator has an opening at its top. The opening opens to the tip of the hollow portion. The center axis of the hollow portion is common to the center axis of the opening. The solder ball regulator also has a pair of projections protruded along the center axis at a position around the opening, where those projections face each other with the center axis therebetween. These projections regulate the movement of the solder ball.

The tip of the hollow portion is tapered when viewing it from the direction of a line connecting the pair of projections and the extreme tips of the tapered tip portions to each other may be used as the projections. The tip may also be formed by a pair of flat surfaces inclined to a datum level including a line connecting the center axis and the pair of projections to each other. The pair of flat surfaces may have the same angle respectively to the datum level and the pair of projections may be symmetrical to the datum level.

In another configuration, the capillary tube is connected to the other side end of the tip portion of the solder ball regulator and formed on the same axis as that of the solder ball regulator. The capillary tube has a cylindrical portion provided with a hollow portion continued to the hollow portion of the solder ball regulator from the viewpoint of space. Furthermore, the inside surfaces of the pair of projections may be a part of a cylindrical surface formed on the same axis as that of the hollow portion respectively.

In still another configuration, the inside surface of the solder ball regulator is polished like a mirror.

In still another configuration, the solder ball regulator and the cylindrical portion, or at least the solder ball regulator, are composed of a first tube-like body and at least a part of the cylindrical tube is composed of a second tube-like body. And, the capillary tube is further provided with a connector for connecting the first and second tube-like bodies to each other.

In still another configuration, the tip portion of the capillary tube is formed with a pair of first flat portions and a pair of second flat surfaces. The pair of the first flat surfaces are inclined by a first angle to the datum level including a line connecting the center axis and the pair of projections and the pair of the second flat surfaces are continued to the pair of the first flat surfaces and inclined by a second angle to the datum level.

The solder ball connection device, which is another invention, is provided with a capillary tube described in claim 1; a solder ball reservoir for supplying a solder ball into the capillary tube, the diameter of the solder ball being smaller than the inner diameter of the opening; and a laser output device for applying a focused laser beam to the opening of the capillary tube through the hollow portion. The datum level including a line connecting the center axis, as well as the first and second projections of the capillary tube is set so as to be inclined to the first and second connection surfaces, thereby the solder ball is reflowed.

In another configuration, the solder ball connection device is provided with a capillary tube described in claim 4; a solder ball reservoir for supplying a solder ball into the capillary tube, the diameter of the solder ball being smaller than the inner diameter of the opening; and a laser output device for applying a focused laser beam to the opening of the capillary tube through the hollow portion. The datum level including a line connecting the center axis, as well as the first and second projections of the capillary tube is set so as to be inclined by 45° to the first and second connection surfaces, thereby the solder ball is reflowed.

Furthermore, the solder ball connection device is further provided with a nitrogen gas supplier for supplying a nitrogen gas into the capillary tube.

DETAILED DESCRIPTION OF THE PREFERRED EMBODIMENT

Figure 1:
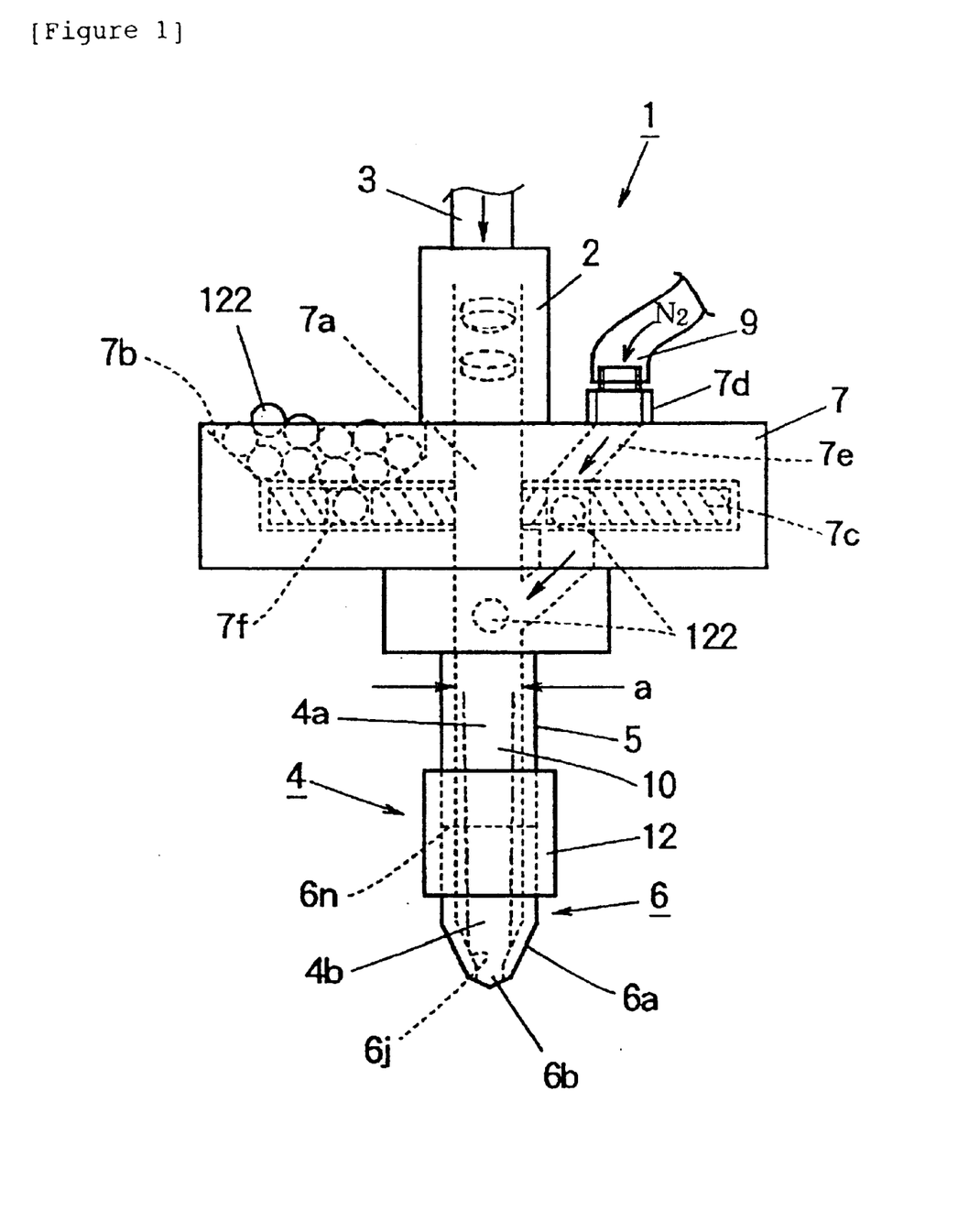
FIG. 1 is a schematic view of a solder ball connection device in which a capillary tube is installed in an embodiment of the present invention.

FIG. 1 is a schematic view of one embodiment of a capillary tube and a solder ball connection device in which the capillary tube is installed. An optical system 2 provided in the solder ball connection device 1 receives a laser light oscillated by a laser generator (not shown) through optical fiber 3 and obtains a laser beam through an optical system for focusing the laser light. The optical system 2 then outputs the laser beam into the hollow portion of the capillary tube 4 through a laser beam path 7a of a solder ball reservoir 7.

Figure 3:
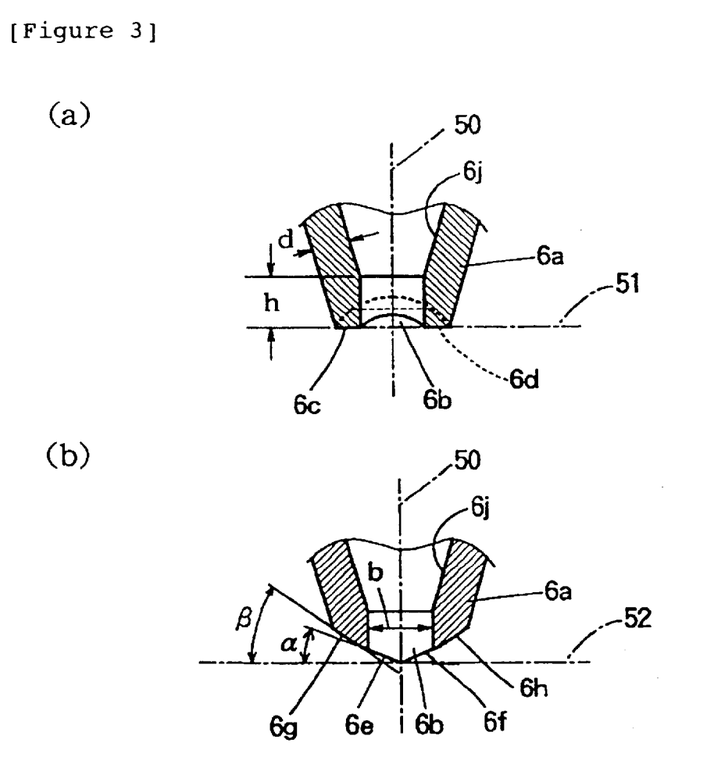
FIGS. 3(a) and 3(b) are sectional views of the conic portion 6a of the action tube 6.

The capillary tube 4 is composed of a hollow cylindrical tube 5 attached to the solder ball reservoir 7; an action tube 6 provided continuously to the tip of the hollow cylindrical tube having a tapered conic portion 6a; and a connection tube 12 for connecting the cylindrical tube 5 to the action tube 6. The capillary tube 4 also has a cylindrical portion 4a having an inner diameter 'a' and a conic portion 4b inside. The conic portion 4b is formed in the action tube 6 so as to be continued to the cylindrical portion 4a. At the tip of the action tube 6 is formed an opening 6b for holding a solder ball. The ball holding opening 6b has an inner diameter 'b' (FIG. 3) and it is communicated with the inner conic portion 4b.

A part of the capillary tube 4, where the cylindrical portion 4a having inner diameter a exists, is formed cylindrically and another part inside the capillary tube 4, where the conic portion 4b exists, is equivalent to the solder ball regulator described above. And, the action tube 6 is equivalent to the first tube body provided with a solder ball regulator and the cylindrical tube 5 is equivalent to the second tube body provided with a cylindrical portion. Furthermore, the connection tube 12 is equivalent to the connector for connecting those portions each other as described above.

In the solder ball reservoir 7 are formed a laser beam path 7a connecting the optical system 2 to the hollow portion inside the capillary tube 4; a solder ball storage 7b for storing a plurality of solder balls 122; a solder ball singulation disk 7c held rotationally by itself in the solder ball reservoir 7 by driving means (not shown); an intake pipe 7d for taking in nitrogen gas ($N_2$) from a nitrogen gas bomb (not shown) through a tube 9; and a gas path 7e for feeding the taken-in nitrogen gas into the laser beam path 7a.

The solder ball singulation disk 7c has a plurality of solder ball storing halls 7f formed by a predetermined number, disposed at equal pitches on the outer periphery of a predetermined radius from the center of the rotation. A solder ball 122 is fallen and stored in the solder ball storage 7b when one of the ball storing halls 7f is aligned to a hole (not shown) formed at the bottom of the solder ball storage 7b. And, when the solder ball singulation disk 7c is rotated and a solder ball storing hall 7f having a solder ball inside is moved into the gas path 7e, the solder ball 122 falls naturally and it is prompted to be fed into the capillary tube 4 by the nitrogen gas flowing in the direction of the arrow in the gas path 7e.

At this time, another solder ball storing hole 7f formed in the ball transfer tray 7c is configured so as to move to a position of being brought into line with the hole (not shown) formed at the bottom of the solder ball storage 7b. Each time the solder ball singulation disk 7c is rotated by a predetermined angle at a timing to be described later, the above described ball transfer operation is repeated, thereby one solder ball 122 is fed into the capillary tube 4.

Inside the capillary tube 4 is formed a path used both for falling the solder ball 122 and for passing the focused laser beam 10. Consequently, the inner diameter a of the cylindrical portion 4a provided in the capillary tube 4 is set larger than the beam diameter of the focused laser beam 10, thereby preventing the focused laser beam from the energy loss to be caused by reflections, etc. On the other hand, because the focused laser beam hits and reflects on the conic portion 4b inside the capillary tube 4, the inner wall 6j at that portion is polished like a mirror.

Hard metal or zirconia excellent in heat resistance will be suitable especially as the material of the action tube 6 formed at the tip of the capillary tube 4. The mirror finishing process for the hard metal is done by a machine and the zirconia whose reflectivity is low is improved for the reflectivity through sputtering with use of such a metal with a high reflectivity as aluminum, gold, silver, or the like.

In the above described embodiment, the capillary tube is composed so that the cylindrical tube 5 and the action tube 6 are united. Consequently, it is possible to shorten the distance between the inner wall 6j of the conic portion to be mirror-finished and the opening of the connection portion 6n in the action tube 6, thereby the mirror finishing process can be carried out smoothly.

Figure 2:
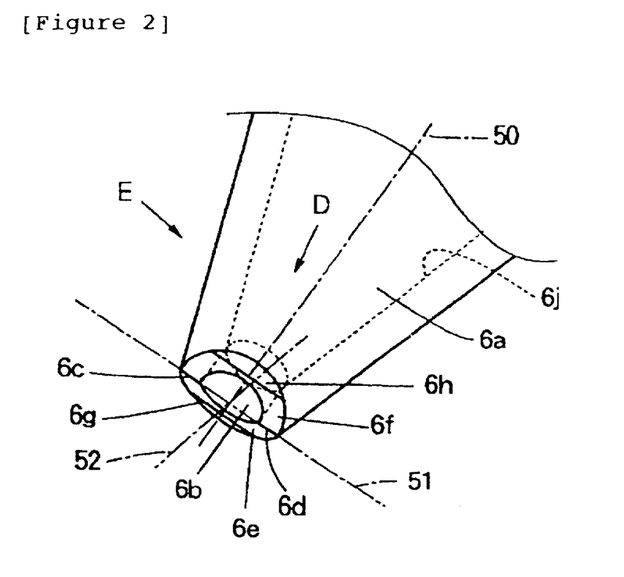
FIG. 2 is a perspective view of a conic portion 6a of an action tube 6, which is a component of the capillary tube 4 in the embodiment of the present invention.

FIG. 2 is a perspective view of the tip shape of the conic portion 6a of the action tube 6, which is a component of the capillary tube 4 of the embodiment according to the present invention. FIG. 3(a) is a cross sectional view of a portion from the direction of the arrow D. the portion including the center line 50 of the action tube 6 shown in FIG. 2 and a datum line 51 orthogonal to this center line 50 and passing the tip ridge lines 6c and 6d formed in a process to be described later. FIG. 3(b) is a cross sectional view of a portion from the direction of the arrow E, the portion including the datum line 52 orthogonal to both of the center line 50 and the datum line 51, as well as the center line 50.

As shown in FIG. 3(b), at this tip are formed first tapered surfaces 6e and 6f at an angle of alpha and second tapered surfaces 6g and 6h at an angle of beta (beta>alpha) so as to be continued to the first tapered surfaces. The first tapered surfaces 6e and 6f, as well as the second tapered surfaces 6g and 6h are formed symmetrically with respect to the datum level including the center line 50 and the datum line 51 extending in a vertical direction on the paper with FIG. 3(b). In addition, the extreme tip ridge line on the datum line 51 crossed by the tapered surfaces 6e and 6f becomes the tip ridge lines 6c and 6d.

The inner diameter b (FIG. 3) of a ball ejection hall 6b is decided to a size in which the solder ball 122 (FIG. 4) can play freely. The depth h from the ridge lines 6c and 6d is decided necessarily by the thickness d, the taper angles alpha, beta, etc. of the action tube 6.

The solder ball connection device 1 composed as described above is held by a transfer device (not shown) slidably in the directions F and G (FIG. 1) in which the gravity can be used. On the other hand, the HG assembly 100 (FIG. 8) is held by a holder (not shown) so as to be inclined at substantially 45° in the direction F and G in which the gravity can be used respectively so that the connection surfaces 118a and 112b of the bonding pad 118 and the lead pad 112a face each other substantially perpendicularly as shown in FIG. 4.

The HG assembly 100 (FIG. 8) and the solder ball connection device 1 held respectively as described above, when the solder ball connection device 1 moves by a predetermined distance in the direction G, are positioned relatively so that the tip of the conic portion 6a of the action tube 6 makes an approach to both of the bonding pad 118 and the lead pad 112a equally.

Furthermore, the action tube 6 is attached so that the datum line 51 (FIG. 2) becomes in parallel to the connection surfaces 118a and 112b of the bonding pad 118 and the lead pad 112a.

Figure 4:
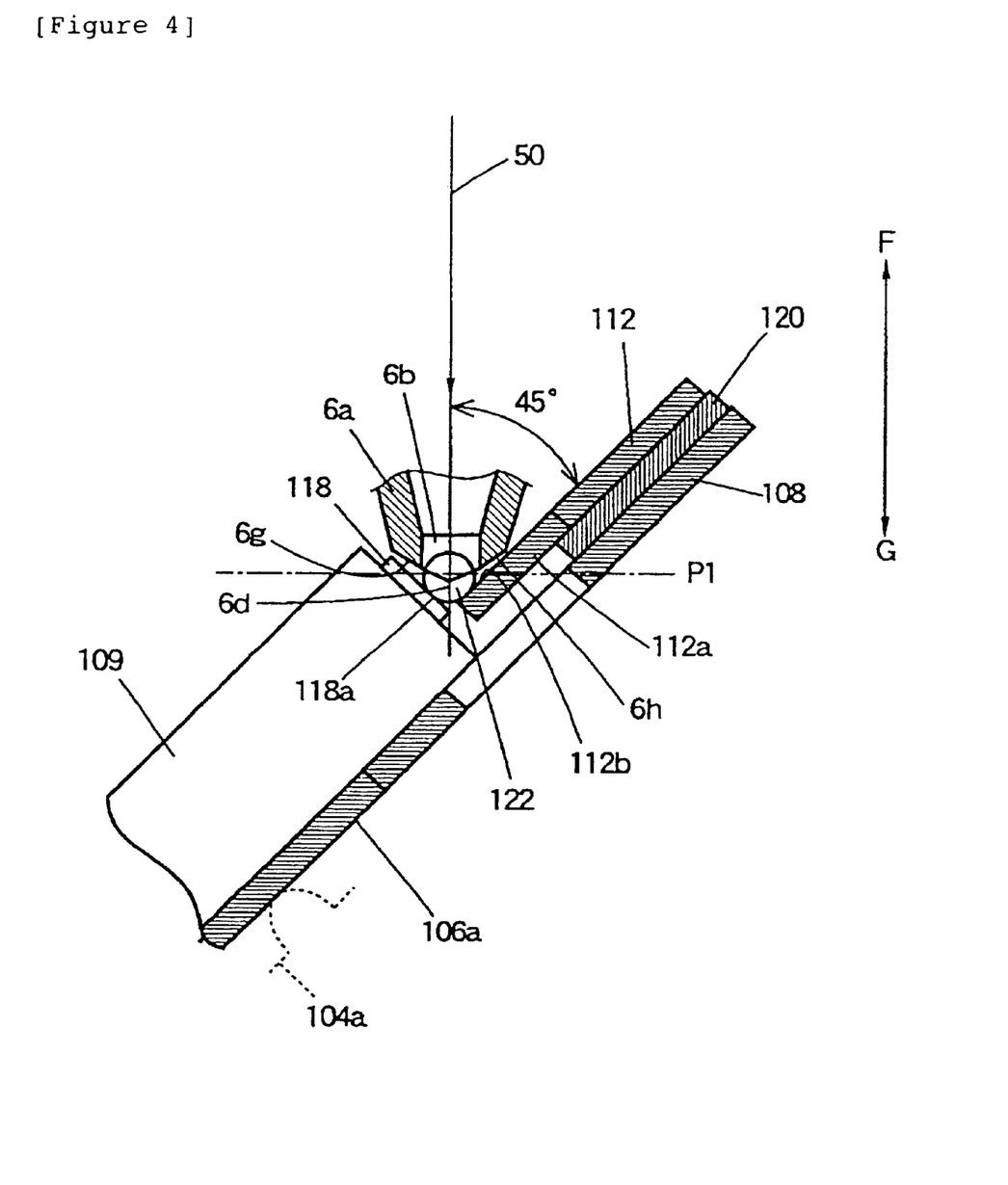
FIG. 4 is a sectional view showing a positional relationship among the conic portion 6a, a bonding pad 118, and a lead pad 112a for a solder ball connection with use of the capillary tube 4 of the present invention.

To carry out a solder ball connection processing in the configuration as described above, the tip of the conic portion 6a of the action tube 6 is moved to a position shown in FIG. 4 first. At this time, the second tapered surfaces 6g and 6h of the conic portion 6a approach the bonding pad 118 and the lead pad 112a almost coming in contact with them, but they are in a position where they do not come into contact with each other.

After that, the solder ball singulation disk 7c (FIG. 1) is rotated by a predetermined angle, thereby feeding one solder ball 122 into the capillary tube 4 through the nitrogen gas path 7e. The solder ball 122 then falls into the capillary tube 4 and guided into the ball ejection hole 6b. It then stops at a position where the ball comes in contact with the connection surfaces 118a and 112b of the bonding pad 118 and the lead pad 112a shown in FIG. 4. During this time, the nitrogen gas is injected into the capillary tube 4 from the intake pipe 7d at a predetermined rate so as to prompt the solder ball to fall in the capillary tube 4, as well as presses the solder ball 122 against the connection surfaces 118a and 112b with its wind pressure.

At this time, because the tip ridge lines 6c and 6d of the action tube 6 are positioned so as to be advanced more in the direction G than the regulation point P1 passing the center of the solder ball 122, the movement of the solder ball 122 towards the datum line 51 (FIG. 3(a)) is regulated by inner walls of the ridge lines 6c and 6d of the conic portion 6a at the regulation point P1.

Figure 6:
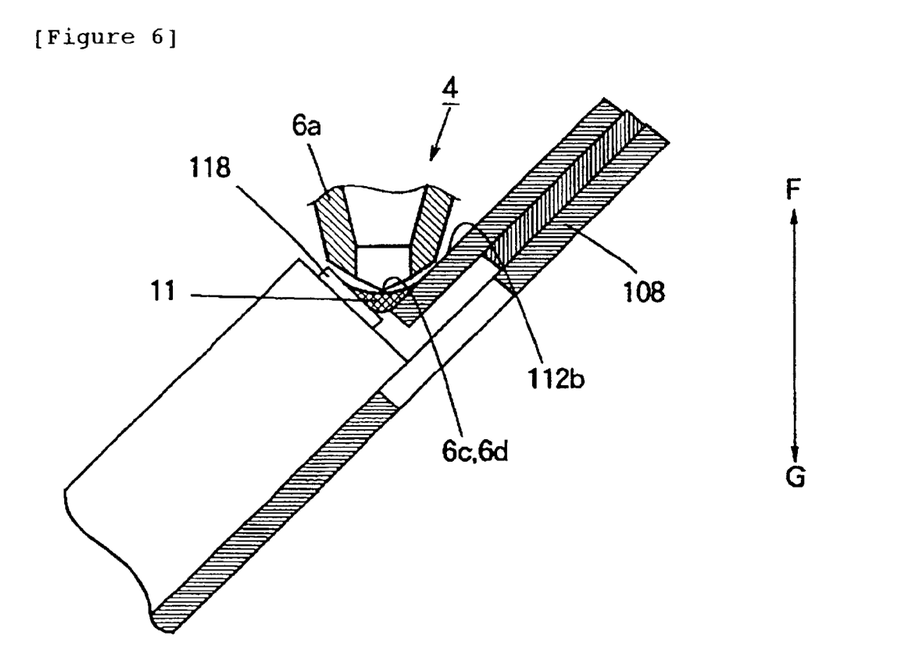
FIG. 6 is a sectional view showing a positional relationship among liquefied solder 11, and tip ridge lines 6c and 6d.

On the other hand, the movement of the solder ball 122 towards the datum line 52 (FIG. 3(b)) is regulated by the connection surfaces 118a and 112a of the bonding pad 118 and the lead pad 112a. Consequently, the solder ball 122 is positioned at a predetermined position, although it can move to the right/left slightly according to the difference between the its diameter c and the inner diameter b of the ball holding opening 6b (FIG. 6).

Figure 5:
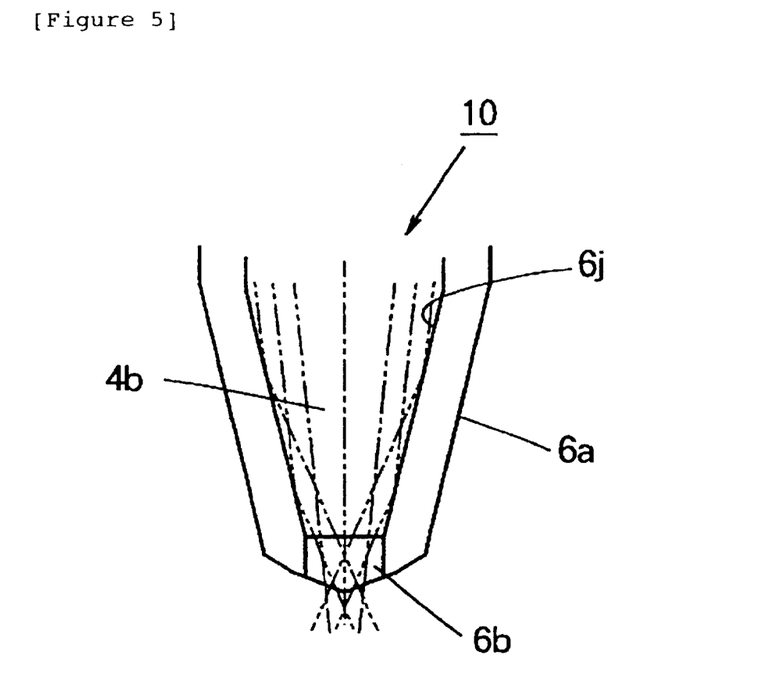
FIG. 5 is a sectional view showing a route of a focused laser beam to a ball holding opening 6b, the focused laser beam advancing while reflecting on the inner wall 6j of the conic portion.

The laser light is emitted in this state. At this time, the focused laser beam 10 (FIG. 1) passes through the hollow cylindrical portion 4a of the capillary tube 4 and reaches the ball holding opening 6b while a part of the focused laser beam 10 is kept reflected on the mirror-finished inner wall 6j of the conic portion 4b as shown in FIG. 5. The focused laser beam 10 then is irradiated on the solder ball 122 (FIG. 4) positioned there.

The solder ball 122 is melted by the irradiation of this laser beam, thereby making the connection surfaces 118a and 112a of the bonding pad 118 and the lead pad 112a wet and connected properly.

The nitrogen gas supplied at this time presses the melted solder against each connection surface and cover the solder so as to be protected from oxidation.

FIG. 6 shows a positional relationship among the solder 11 liquefied in reflowing and the tip ridge lines 6c and 6d of the capillary tube 4. As shown in FIG. 6, if the tip ridge lines 6c and 6d are positioned so as to be advanced excessively in the direction G, they come in contact with the solder when in reflowing, thereby narrowing the gap through which the nitrogen gas is fed from the ball holding opening. Consequently, the gap is deviated, thereby the liquid solder is deformed.

These factors will then distort the shape of soldered portions and often cause contact failures.

This is why the tapered angles a and b shown in FIG. 3(b) are set so that the capillary tube 4 is positioned so as to be advanced slightly in the direction G from the regulated point P1 where the tip ridge lines 6c and 6d pass the center of the solder ball 122 if the second tapered surfaces 6g and 6h of the action tube 6 are moved to a predetermined position closest to the bonding pad 118 and the lead pad 112a respectively.

According to the capillary tube in the above described embodiment, therefore, it is possible to prevent the extreme tip of the capillary from touching liquid solder, as well as to enable the nitrogen gas to flow out in every direction, thereby soldering the object surfaces together free of distortion in shape.

In the embodiment described with reference to FIG. 3(b), the first tapered surfaces 6e and 6f are formed at an angle of a and the second tapered surfaces 6g and 6h continued to the first tapered surfaces are formed at an angle of b respectively. However, the tip ridge lines 6c and 6d may also be formed with tapered surfaces formed only at one tapered angle.

Figure 7:
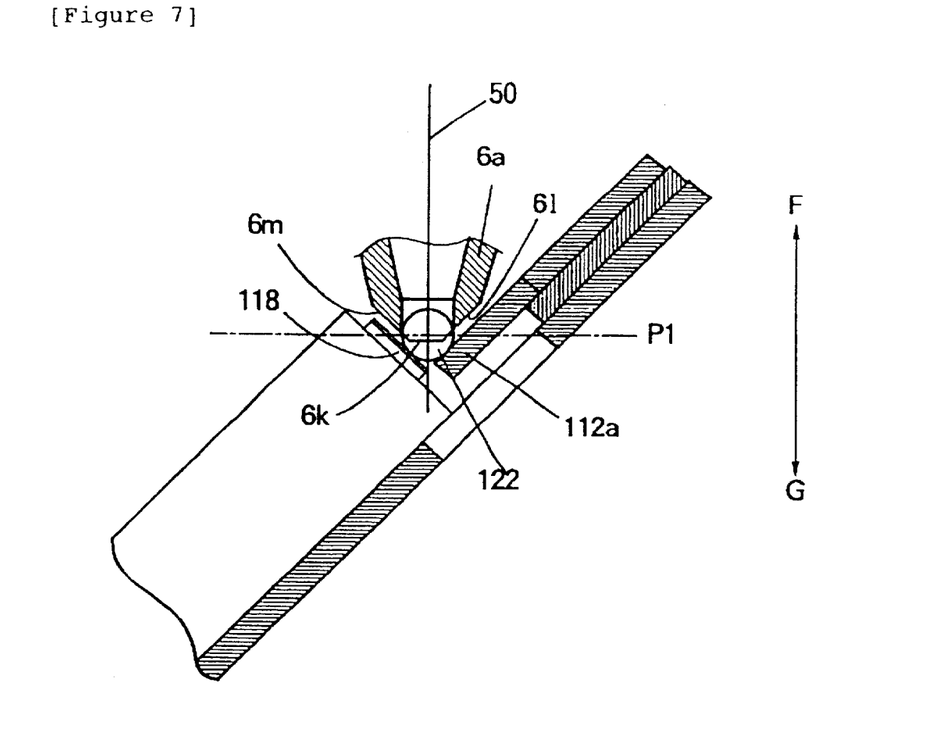
FIG. 7 is a sectional view of the capillary tube in another embodiment of the present invention.

Furthermore, as shown in FIG. 7 for another embodiment of the present invention, it may also be possible to form a pair of tapered portions 6m and 6l just like in the above described embodiment, as well as an extreme tip surface 6k perpendicular to the center line 50 so that the tip surface 6k is positioned so as to be slightly advanced in the direction G from the regulation point P1 passing the center of the solder ball 122. It is no need to form any ridge line at the extreme tip of the conic portion 6a at this time.

In the above described embodiment, a pair of projections of the tip of the solder ball regulator are formed at a portion where the first and second tapered surfaces are formed so that the tip ridge lines 6c and 6d are assumed as the tips of those first and second tapered surfaces. However, the pair of the projections are not limited only to those; they may be formed in various shapes such as bar-like projections.

Furthermore, in the above described embodiment, the center axis of the capillary tube is set so that its tip comes close to each flat surface while the center axis is inclined by substantially 45° to the connection surfaces 118a and 112b of the bonding pad 118 and the lead pad 112a respectively and the tapered surfaces at the tip of the capillary tube are formed symmetrically with respect to the surface including the center axis. However, the present invention is not limited to this, and the relationship between those items may be varied according to various required conditions.

Although the external shape of the solder ball regulator is formed conic in the above described embodiment, the shape may be varied freely unless it touches the slider and the leads during a work.

According to the capillary tube and the solder ball connection device of the present invention, a solder ball to reflow can be held in a stable manner, thereby solder connections can be made at predetermined points and it is possible to prevent connection failures to be caused by positional deviation of the connection.

Furthermore, because the surface on which the laser beam reflects is mirror-finished, it is possible to reduce the energy loss of the laser beam to be caused by such a reflection, as well as reduce the energy loss of the laser beam to occur when in reflowing, thereby making solder ball connections more efficiently.

What is claimed is:

1. A capillary tube employed for a solder ball connection device used to connect a first connection surface of a pad formed at a slider held by a slider holder in a disk apparatus, and a second connection surface of a pad formed at an end of a lead wired to said slider holder and disposed substantially perpendicular to and close to a flat portion including said first connection surface together with use of a solder ball, comprising:

a solder ball regulator having a substantially conic, hollow portion inside; wherein said solder ball regulator has:

an opening communicating with the top of said hollow portion in a tip portion, a center axis of said opening being common to a center axis of said hollow portion, and a pair of projections protruded along said center axis at a position around said opening, where said projections face each other with said center axis therebetween; and said projection regulates movement of said solder ball.

2. The capillary tube according to claim 1, wherein:

said tip portion is tapered when viewed from a line connecting a pair of said projections to each other; and an extreme tip of said tapered tip portion forms said projections.

3. The capillary tube according to claim 2, wherein said tip portion is formed with a pair of flat portions inclined to a datum plane including a line connecting said center axis and a pair of said projections to each other.

4. The capillary tube according to claim 3, wherein:

a pair of said flat portions are inclined at an equal angle respectively to said datum plane; and a pair of said projections are disposed symmetrically with respect to said datum plane.

5. The capillary tube according to claim 2, wherein said tip portion is formed with a pair of first flat surfaces inclined by a first angle to a datum surface including a line connecting said center axis and a pair of said projections and a pair of second flat surfaces continued to a pair of said first flat surfaces and inclined by a second angle to said datum surface.

6. A capillary tube employed for a solder ball connection device used to connect a first connection surface of a pad formed at a slider held by a slider holder in a disk apparatus, and a second connection surface of a pad formed at an end of a lead wired to said slider holder and disposed substantially perpendicular to and close to a flat portion including said first connection surface together with use of a solder ball, comprising:

a solder ball regulator having a substantially conic, hollow portion inside; wherein said solder ball regulator has:

an opening communicating with the top of said hollow portion in a tip portion, a center axis of said opening being common to a center axis of said hollow portion;

a pair of projections protruded along said center axis at a position around said opening, where said projections face each other with said center axis therebetween; wherein said projection regulates movement of said solder ball; and a cylindrical portion connected to the other side end of said tip portion of said solder ball regulator, formed on the same axis as that of said solder ball regulator, and provided with a hollow portion spatially continued to said hollow portion of said solder ball regulator.

7. The capillary tube according to claim 6, wherein:

said tip portion is tapered when viewed from a line connecting a pair of said projections to each other; and an extreme tip of said tapered tip portion forms said projections.

8. The capillary tube according to claim 7, wherein said tip portion is formed with a pair of flat portions inclined to a datum plane including a line connecting said center axis and a pair of said projections to each other.

9. The capillary tube according to claim 8, wherein:

a pair of said flat portions are inclined at an equal angle respectively to said datum plane; and a pair of said projections are disposed symmetrically with respect to said datum plane.

10. A capillary tube employed for a solder ball connection device used to connect a first connection surface of a pad formed at a slider held by a slider holder in a disk apparatus, and a second connection surface of a pad formed at an end of a lead wired to said slider holder and disposed substantially perpendicular to and close to a flat portion including said first connection surface together with use of a solder ball, comprising:

a solder ball regulator having a substantially conic, hollow portion inside; wherein said solder ball regulator has:

an opening communicating with the top of said hollow portion in a tip portion, a center axis of said opening being common to a center axis of said hollow portion;

a pair of projections protruded along said center axis at a position around said opening, where said projections face each other with said center axis therebetween; wherein said projection regulates movement of said solder ball; and wherein inside surfaces of a pair of said projections compose a part of a cylindrical surface formed on the same axis as that of said hollow portion.

11. The capillary tube according to claim 10, wherein:

said tip portion is tapered when viewed from a line connecting a pair of said projections to each other; and an extreme tip of said tapered tip portion forms said projections.

12. The capillary tube according to claim 11, wherein said tip portion is formed with a pair of flat portions inclined to a datum plane including a line connecting said center axis and a pair of said projections to each other.

13. The capillary tube according to claim 12, wherein:

a pair of said flat portions are inclined at an equal angle respectively to said datum plane; and a pair of said projections are disposed symmetrically with respect to said datum plane.

14. A capillary tube employed for a solder ball connection device used to connect a first connection surface of a pad formed at a slider held by a slider holder in a disk apparatus, and a second connection surface of a pad formed at an end of a lead wired to said slider holder and disposed substantially perpendicular to and close to a flat portion including said first connection surface together with use of a solder ball, comprising:

a solder ball regulator having a substantially conic, hollow portion inside; wherein said solder ball regulator has:

an opening communicating with the top of said hollow portion in a tip portion, a center axis of said opening being common to a center axis of said hollow portion;

a pair of projections protruded along said center axis at a position around said opening, where said projections face each other with said center axis therebetween; wherein said projection regulates movement of said solder ball; and wherein an inner wall of said solder ball regulator is mirror-finished.

15. The capillary tube according to claim 14, wherein:

said tip portion is tapered when viewed from a line connecting a pair of said projections to each other; and an extreme tip of said tapered tip portion forms said projections.

16. The capillary tube according to claim 15, wherein said tip portion is formed with a pair of flat portions inclined to a datum plane including a line connecting said center axis and a pair of said projections to each other.

17. The capillary tube according to claim 16, wherein:

a pair of said flat portions are inclined at an equal angle respectively to said datum plane; and a pair of said projections are disposed symmetrically with respect to said datum plane.

18. A capillary tube employed for a solder ball connection device used to connect a first connection surface of a pad formed at a slider held by a slider holder in a disk apparatus, and a second connection surface of a pad formed at an end of a lead wired to said slider holder and disposed substantially perpendicular to and close to a flat portion including said first connection surface together with use of a solder ball, comprising:

a solder ball regulator having a substantially conic, hollow portion inside; wherein said solder ball regulator has:

an opening communicating with the top of said hollow portion in a tip portion, a center axis of said opening being common to a center axis of said hollow portion;

a pair of projections protruded along said center axis at a position around said opening, where said projections face each other with said center axis therebetween; wherein said projection regulates movement of said solder ball; and wherein said solder ball regulator and a cylindrical portion, or at least said solder ball regulator, are composed of a first tube-shaped body;

at least a part of said cylindrical portion is composed of a second tube-shaped body; and said capillary tube further comprises a connector for connecting said first and second tube-shaped bodies to each other.

19. The capillary tube according to claim 18, wherein:

said tip portion is tapered when viewed from a line connecting a pair of said projections to each other; and an extreme tip of said tapered tip portion forms said projections.

20. The capillary tube according to claim 19, wherein said tip portion is formed with a pair of flat portions inclined to a datum plane including a line connecting said center axis and a pair of said projections to each other.

21. The capillary tube according to claim 20, wherein:

a pair of said flat portions are inclined at an equal angle respectively to said datum plane; and a pair of said projections are disposed symmetrically with respect to said datum plane.

22. A solder ball connection apparatus, comprising:

a capillary tube employed for a solder ball connection device used to connect a first connection surface of a pad formed at a slider held by a slider holder in a disk apparatus, and a second connection surface of a pad formed at an end of a lead wired to said slider holder and disposed substantially perpendicular to and close to a flat portion including said first connection surface together with use of a solder ball;

a solder ball regulator having a substantially conic, hollow portion inside; wherein said solder ball regulator has:

an opening communicating with the top of said hollow portion in a tip portion, a center axis of said opening being common to a center axis of said hollow portion;

a pair of projections protruded along said center axis at a position around said opening, where said projections face each other with said center axis therebetween; wherein said projection regulates movement of said solder ball; and further comprising:

a solder ball reservoir for supplying a solder ball in said capillary tube, solder ball reservoir having a diameter smaller than the inner diameter of an opening of said capillary tube;

a laser output device for applying a focused laser beam to said opening of said capillary tube through said hollow portion; wherein said datum surface includes a line connecting said center axis of said capillary tube and said projections to each other is inclined to said first and second connection surfaces, thereby reflowing said solder ball.

23. A solder ball connection apparatus of claim 22, wherein:

said tip portion of the capillary tube is tapered when viewed from a line connecting a pair of said projections to each other;

an extreme tip of said tapered tip portion forms said projections;

said tip portion is formed with a pair of flat portions inclined to a datum plane including a line connecting said center axis and a pair of said projections to each other;

a pair of said flat portions are inclined at an equal angle respectively to said datum plane; and a pair of said projections are disposed symmetrically with respect to said datum plane.

24. The solder ball connection device according to claim 22, further comprising a nitrogen gas supplier for supplying a nitrogen gas into said capillary tube.

* * * * *